(12) United States Patent
Chiang et al.

(10) Patent No.: US 9,478,609 B2
(45) Date of Patent: Oct. 25, 2016

(54) INTEGRATED CIRCUIT WITH MULTIPLE CELLS HAVING DIFFERENT HEIGHTS

(71) Applicant: TAIWAN SEMICONDUCTOR MANUFACTURING COMPANY, LTD., Hsinchu (TW)

(72) Inventors: Ting-Wei Chiang, New Taipei (TW); Li-Chun Tien, Tainan (TW); Ming-Jin Huang, New Taipei (TW); Pin-Dai Sue, Tainan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 197 days.

(21) Appl. No.: 14/328,408

(22) Filed: Jul. 10, 2014

(65) Prior Publication Data

US 2016/0013271 A1 Jan. 14, 2016

(51) Int. Cl.
*G06F 17/50* (2006.01)
*H01L 29/06* (2006.01)
*H01L 27/02* (2006.01)

(52) U.S. Cl.
CPC ....... *H01L 29/0657* (2013.01); *G06F 17/5072* (2013.01); *H01L 27/0207* (2013.01)

(58) Field of Classification Search
CPC ........... G06F 17/5045; G06F 17/5052; G06F 17/5068; G06F 17/5072; G06F 17/5077
USPC ......... 716/100, 110, 119–120, 126–127, 133
See application file for complete search history.

(56) References Cited

U.S. PATENT DOCUMENTS

| | | | |
|---|---|---|---|
| 2004/0060030 A1* | 3/2004 | Fujimoto | G06F 17/5068 326/101 |
| 2010/0287518 A1* | 11/2010 | Becker | G06F 17/5072 716/123 |

* cited by examiner

*Primary Examiner* — Paul Dinh
(74) *Attorney, Agent, or Firm* — Hauptman Ham, LLP

(57) ABSTRACT

An integrated circuit comprises a first cell having first cell height and a first line routed at a first line height and having a first line width. The integrated circuit also comprises a second cell having a second cell height different from the first cell height and a second line routed at a second line height and a second line width different from the first line width. The integrated circuit further comprises a third cell. The third cell has a third line having a first end and a second end. The first end has a first end width. The second end has a second end width. The first end width is equal to the first line width. The second end width is equal to the second line width. The first end is coupled with the first line. The second end is coupled with the second line.

20 Claims, 7 Drawing Sheets

INTEGRATED CIRCUIT WITH MULTIPLE CELLS HAVING DIFFERENT HEIGHTS

BACKGROUND

Device manufacturers are challenged to deliver products that provide value and convenience while meeting the demand for shrinking device size and reduced power consumption. Some integrated circuits comprise multiple cells that have different cell heights.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
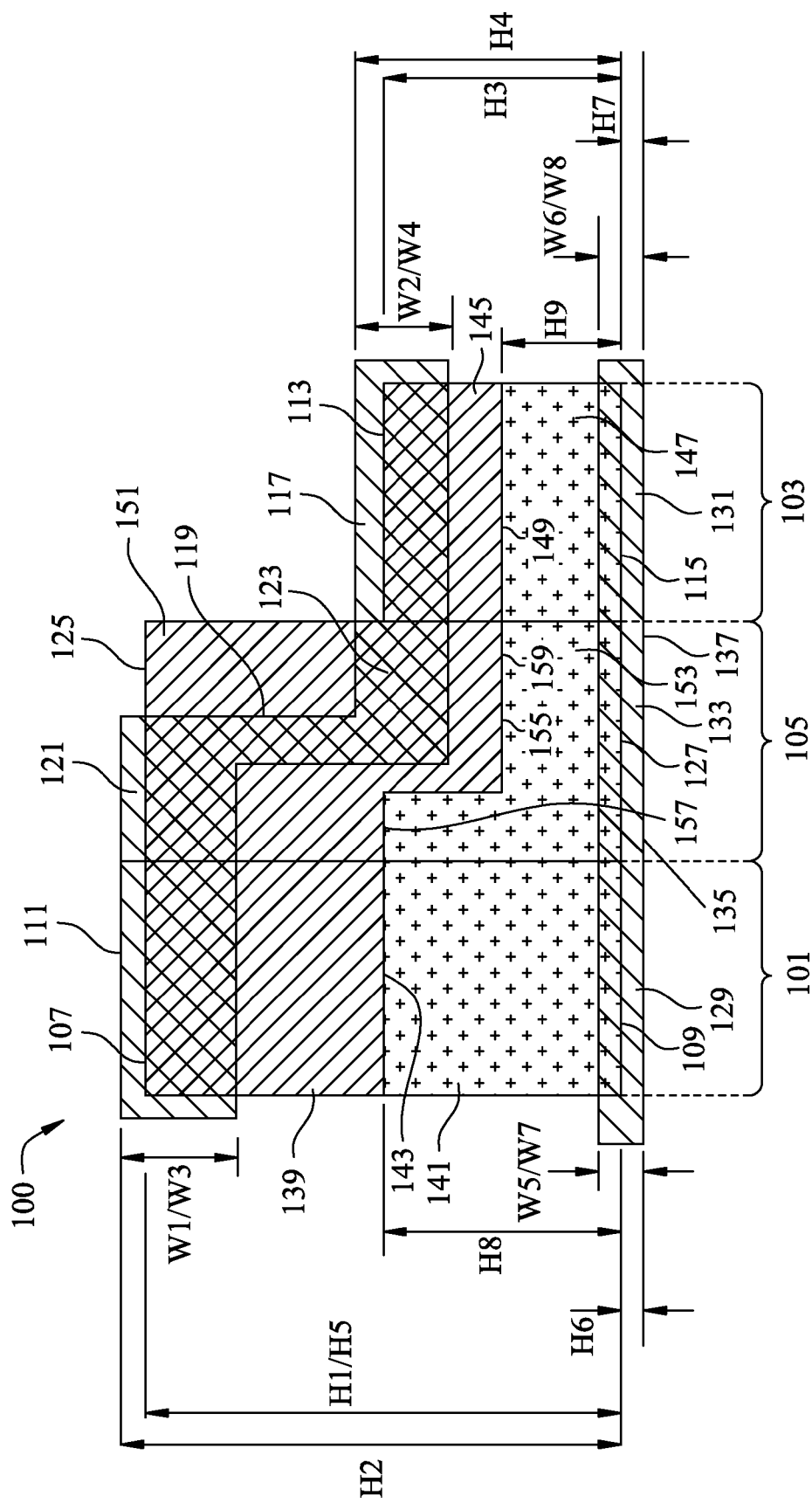
FIG. 1 is a diagram of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some integrated circuits comprise multiple cells that have different cell heights or track heights. The multiple cells have power and ground lines that are difficult to connect, because of the different cell heights.

FIG. 1 is a diagram of an integrated circuit 100, in accordance with one or more embodiments. Integrated circuit 100 comprises a first cell 101, a second cell 103, and a third cell 105. The first cell 101 has a first top surface 107 and a first bottom surface 109. The first top surface 107 is separated from the first bottom surface 109 by a first cell height H1. The first cell has a first line 111 routed at a first line height H2 relative to the first bottom surface 109. The first line height H2 is determined with respect to a side of the first line 111 that is at a greatest distance from the first bottom surface 109 compared to other sides of the first line 111. The first line 111 has a first line width W1.

The second cell 103 has a second top surface 113 and a second bottom surface 115. The second top surface 113 is separated from the second bottom surface 115 by a second cell height H3. The second cell height H3 differs from the first cell height H1. The second cell 103 has a second line 117 routed at a second line height H4 relative to the second bottom surface 115. The second line height H4 is determined with respect to a side of the second line 117 that is at a greatest distance from the second bottom surface 115 compared to other sides of the second line 117. The second line 117 has a second line width W2 that is different from the first line width W1.

The first line height H2 is different from the first cell height H1 and/or the second line height H4 is different from the second cell height H3. In some embodiments, the first line height H2 is equal to the first cell height H1 and/or the second line height H4 is equal to the second cell height H3.

The third cell 105 is a converter cell that abuts the first cell 101 and the second cell 103. The third cell 105 is configured to couple the ground lines and the power lines of different height cells and/or cells having ground lines and power lines at different line heights and/or having different line widths. The third cell 105 has a third line 119 that has a first end 121 and a second end 123. The first end 121 has a first end width W3. The second end has a second end width W4. The first end width W3 is equal to the first line width W1. The second end width W4 is equal to the second line width W2. The first end 121 is coupled with the first line 111. The second end 123 is coupled with the second line 117.

The third cell has a third top surface 125 and a third bottom surface 127. The third top surface 125 is separated from the third bottom surface 127 by a third cell height H5. In some embodiments, the third cell height H5 is equal to the first cell height H1 or the second cell height H3. In other embodiments, the third cell height H5 is less than or greater than one or more of the first cell height H1 or the second cell height H3.

In some embodiments, the third bottom surface 127 is horizontally aligned with one or more of the first bottom surface 109 or the second bottom surface 115. In some embodiments, the third top surface 125 is horizontally aligned with one or more of the first top surface 107 or the second top surface 113. In some embodiments, the third bottom surface 127 is horizontally misaligned with one or more of the first bottom surface 109 or the second bottom surface 115. In some embodiments, the third top surface 125 is horizontally misaligned with one or more of the first top surface 107 or the second top surface 113. In other embodiments, the third top surface 125 is horizontally misaligned with the first top surface 107 and the second top surface 113; and the third bottom surface 127 is horizontally misaligned with the first bottom surface 109 and the second bottom surface 115.

The first line 111, the second line 117, and the third line 119 are one of power lines or ground lines. For example, a power line is a conductive line that is coupled to a voltage source and/or a power source.

The first cell 101 includes a fourth line 129 routed at a fourth line height H6 relative to the first bottom surface 109. The fourth line height H6 is determined with respect to a side of the fourth line 129 that is at a greatest distance from the first bottom surface 109 compared to other sides of the second line fourth line 129. The fourth line 129 has a fourth line width W5. The second cell 103 includes a fifth line 131 routed at a fifth line height H7 relative to the second bottom surface 115. The fifth line height H7 is determined with respect to a side of the fifth line 131 that is at a greatest distance from the second bottom surface 129 compared to other sides of the fifth line 131. The fifth line 131 has a fifth line width W6. The third cell 105 also includes a sixth line 133. The sixth line 133 has a third end 135 and a fourth end 137. The third end 135 has a third end width W7. The fourth end 137 has a fourth end width W8. The third end width W7 is equal to the fourth line width W5. The fourth end width W8 is equal to the fifth line width W6. The third end 135 is coupled with the fourth line 129. The fourth end 137 is coupled with the fifth line 131.

If the first line 111, the second line 117, and the third line 119 are power lines, then the fourth line 129, the fifth line 131, and the sixth line 133 are ground lines. If the first line 111, the second line 117, and the third line 119 are ground lines, then the fourth line 129, the fifth line 131, and the sixth line 133 are power lines.

In some embodiments, the fourth line height H6 is equal to the fifth line height H7. In other embodiments, the fourth line height H6 is different from the fifth line height H7. In some embodiments, one or more of the fourth line 129 is routed along the first bottom surface 109, the fifth line 131 is routed along the second bottom surface 115, or the third line is routed along the third bottom surface 119.

The first cell 101, the second cell 103, and the third cell 105 comprise a substrate material through which or over which, the first line 111, the second line 117, the third line 119, the fourth line 129, the fifth line 131, and the sixth line 133 are routed. The substrate comprises one or more of a semiconductor material, glass, silicon, an oxide, a polymer, or other suitable material. The first cell 101, the second cell 103, and the third cell 105, in some embodiments, comprise substrates having the same material or combination of materials. In other embodiments, the first cell 101, the second cell 103, and/or the third cell 105 comprise substrates having different materials or combinations of materials.

In some embodiments, the substrates of the first cell 101, the second cell 103, and the third cell 105 comprise doped regions. For example, in some embodiments, the first cell 101 comprises a first doped region 139 and a second doped region 141. The first doped region 139 is separated from the second doped region 141 by a first boundary 143. The first boundary 143 has a first boundary height H8 relative to the first bottom surface 109. The second cell 103 comprises a third doped region 145 and a fourth doped region 147. The third doped region 145 is separated from the fourth doped 147 region by a second boundary 149. The second boundary 149 has a second boundary height H9 relative to the second bottom surface 115. The third cell 105 comprises a fifth doped region 151 and a sixth doped region 153. The fifth doped region 151 is separated from the sixth doped region 153 by a third boundary 155. The third boundary 155 is horizontally aligned with the first boundary 143 and the second boundary 145.

The first doped region 139 and the second doped region 141 are doped having opposite doping types. For example, in some embodiments, the first doped region 139 is an n-type region and the second doped region 141 is a p-type region. In other embodiments, the first doped region 139 is a p-type region and the second doped region 141 is an n-type region. The third doped region 145 and the fourth doped region 147 are doped having opposite doping types. For example, in some embodiments, the third doped region 145 is an n-type region and the fourth doped region 147 is a p-type region. In other embodiments, the third doped region 145 is a p-type region and the fourth doped region 147 is an n-type region. The fifth doped region 151 and the sixth doped region 153 are doped having opposite doping types. For example, in some embodiments, the fifth doped region 151 is an n-type region and the sixth doped region 153 is a p-type region. In other embodiments, the fifth doped region 151 is a p-type region and the sixth doped region 153 is an n-type region. In some embodiments, the first doped region 139, the third doped region 145, and the fifth doped region 151 are of the same doping type. In other embodiments, one or more of the first doped region 139, the third doped region 145, or the fifth doped region 151 are of different doping types. In some embodiments, the second doped region 141, the fourth doped region 147, and the sixth doped region 153 are of the same doping type. In other embodiments, one or more of the second doped region 141, the fourth doped region 147, or the sixth doped region 153 are of different doping types.

In some embodiments, first boundary height H8 is equal to the second boundary height H9. In other embodiments, the first boundary height H8 is different from the second boundary height H9, the third boundary 155 has a first portion 157 horizontally aligned with the first boundary 143, and the third boundary 155 has a second portion 159 horizontally aligned with the second boundary 149. In some embodiments one or more of the third line 119 or the sixth line 133 is routed parallel to the third boundary 155.

If the first line height H1 is different from the second line height H4, to couple to first end 121 of the third line 119 with the first line 111 and the second end 125 of the third line 119 with the second line 117, the third line 119 is routed having one of an S-shape, an L-shape, a J-shape, a ramp-shape, a trapezoidal-shape, or other suitable shape. If the fourth line height H6 is different from the sixth line height H7, to couple the third end 135 of the sixth line 133 to the fourth line 129 and the fourth end 137 of the sixth line 133 to the fifth line 131, the sixth line 133 is routed having one of an S-shape, an L-shape, a J-shape, or other suitable shape.

The first line 111, the second line 117, the third line 119, the fourth line 129, the fifth line 131, and the sixth line 133 are electrically conductive lines that comprise one or more electrically conductive materials such as one or more metals or other suitable materials.

Figure 2:
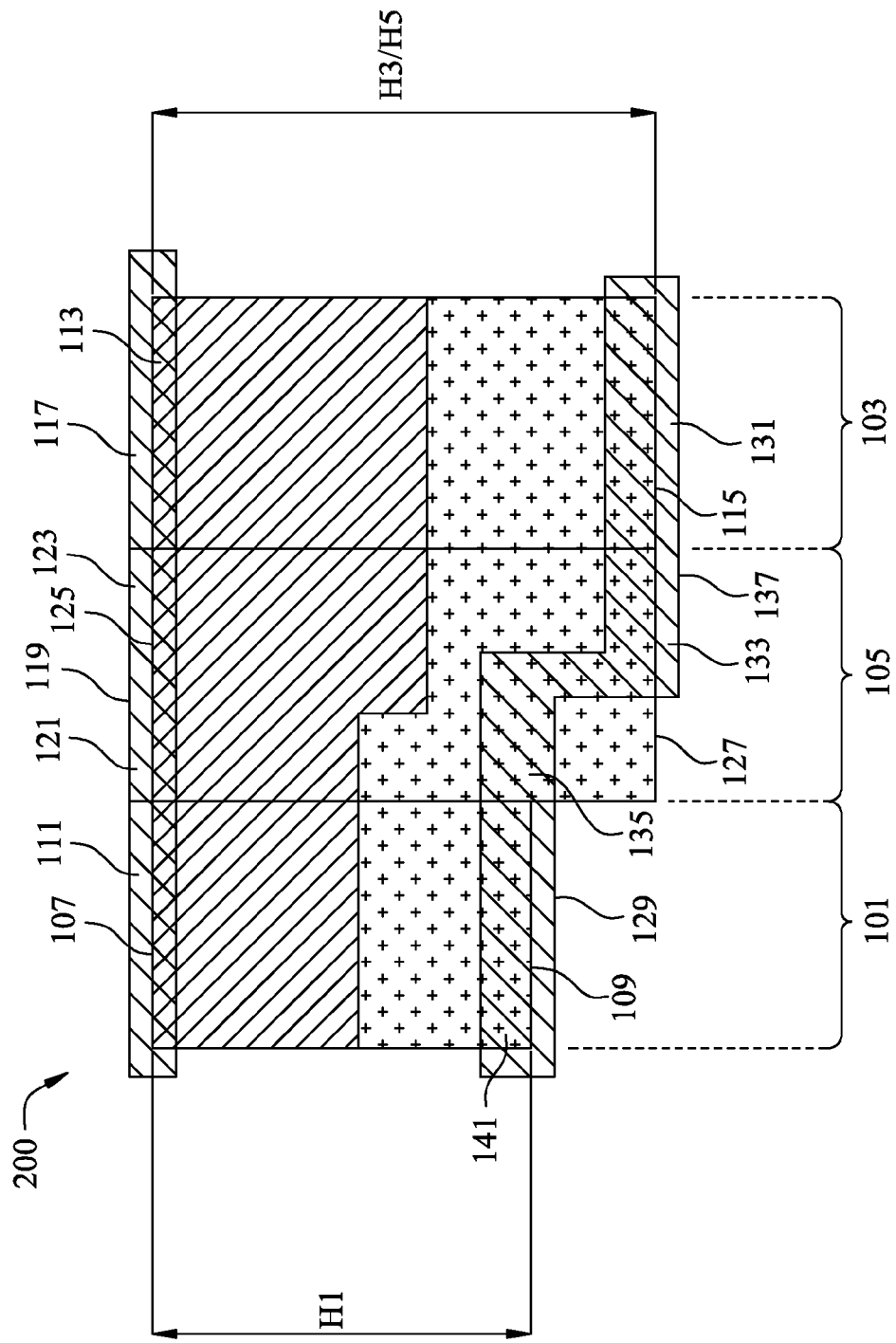
FIG. 2 is a diagram of an integrated circuit, in accordance with some embodiments.

FIG. 2 is a diagram of an integrated circuit 200, in accordance with one or more embodiments. Integrated circuit 200 comprises first cell 101, second cell 103, and third cell 105. The first cell height H1 is less than the second cell height H3. The third cell height H5 is equal to the second cell height H3. The first top surface 107, the second top surface 113, and the third top surface 125 are horizontally aligned. The first bottom surface 109, the second bottom surface 115, and the third bottom surface 127 are horizontally misaligned. The first end 121 of the third line 119 is coupled with the first line 111. The second end 123 of the third line 119 is coupled with the second line 117. The third end 135 of the sixth line 133 is coupled with the fourth line 129. The fourth end 137 of the sixth line 133 is coupled with the fifth line 131.

Figure 3:
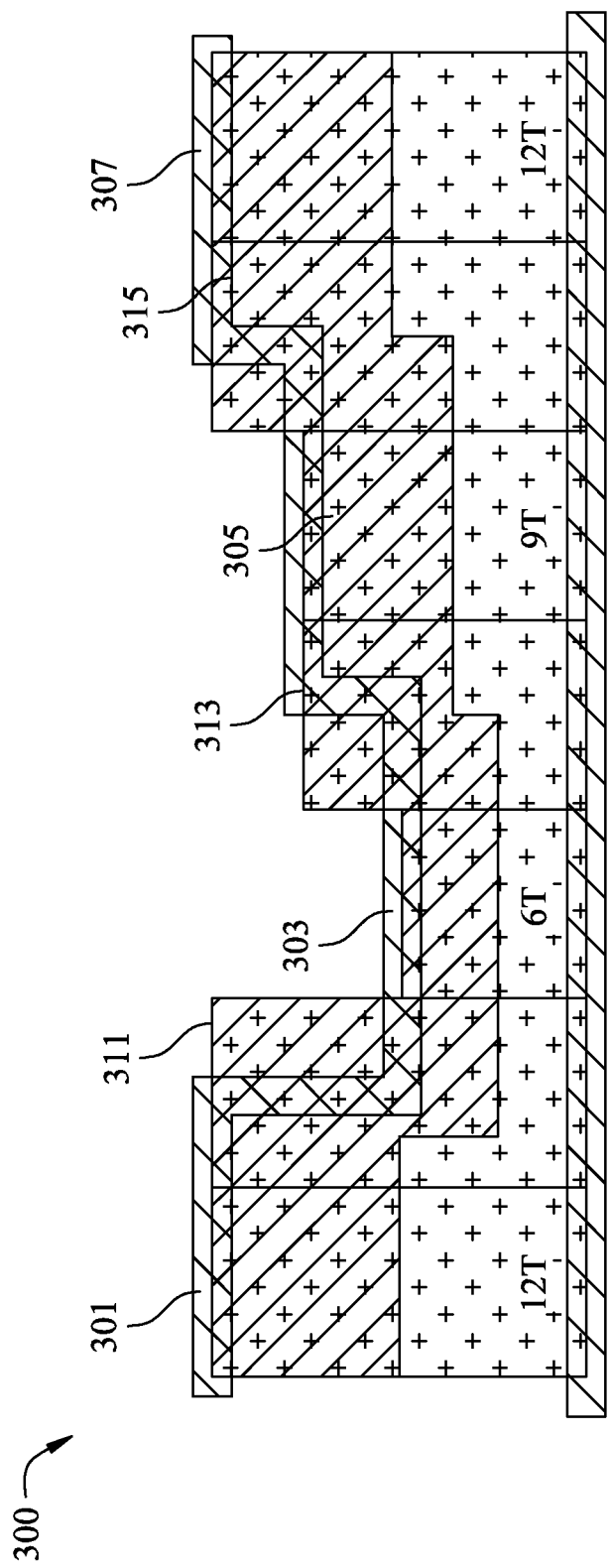
FIG. 3 is a diagram of an integrated circuit, in accordance with some embodiments.

FIG. 3 is a diagram of an integrated circuit 300, in accordance with one or more embodiments. Integrated circuit 300 comprises multiple cells of varying cell heights. The integrated circuit 300 is capable of having a greater or lesser quantity of cells having different combinations of varying cell heights. Though capable of including one or more converter cells such as third cell 105 (FIG. 1) that are configured to couple an N-track cell with a P-track cell (where N is a quantifiable first track height and P is a quantifiable second track height different from the first track height), as an example, the discussed embodiment of integrated circuit 300 includes a first 12-track cell 301, a 6-track cell 303, a 9-track cell 305, and a second 12-track cell 307. The first 12-track cell 301, the 6-track cell 303, the 9-track cell 305, and the second 12-track cell 307 comprise features such as power lines and ground lines similar to those included in integrated circuit 100 (FIG. 1). The integrated circuit 300 also includes converter cells 311, 313 and 315 between the first 12-track cell 301, the 6-track cell 303, the 9-track cell 305, and the second 12-track cell 307. The converter cells 311, 313 and 315 are similar to third cell 105 in that the lines of the converter cells 311, 313 and 315 couple the lines of the neighboring first 12-track cell 301, 6-track cell 303, 9-track cell 305, and second 12-track cell 307.

Figure 4:
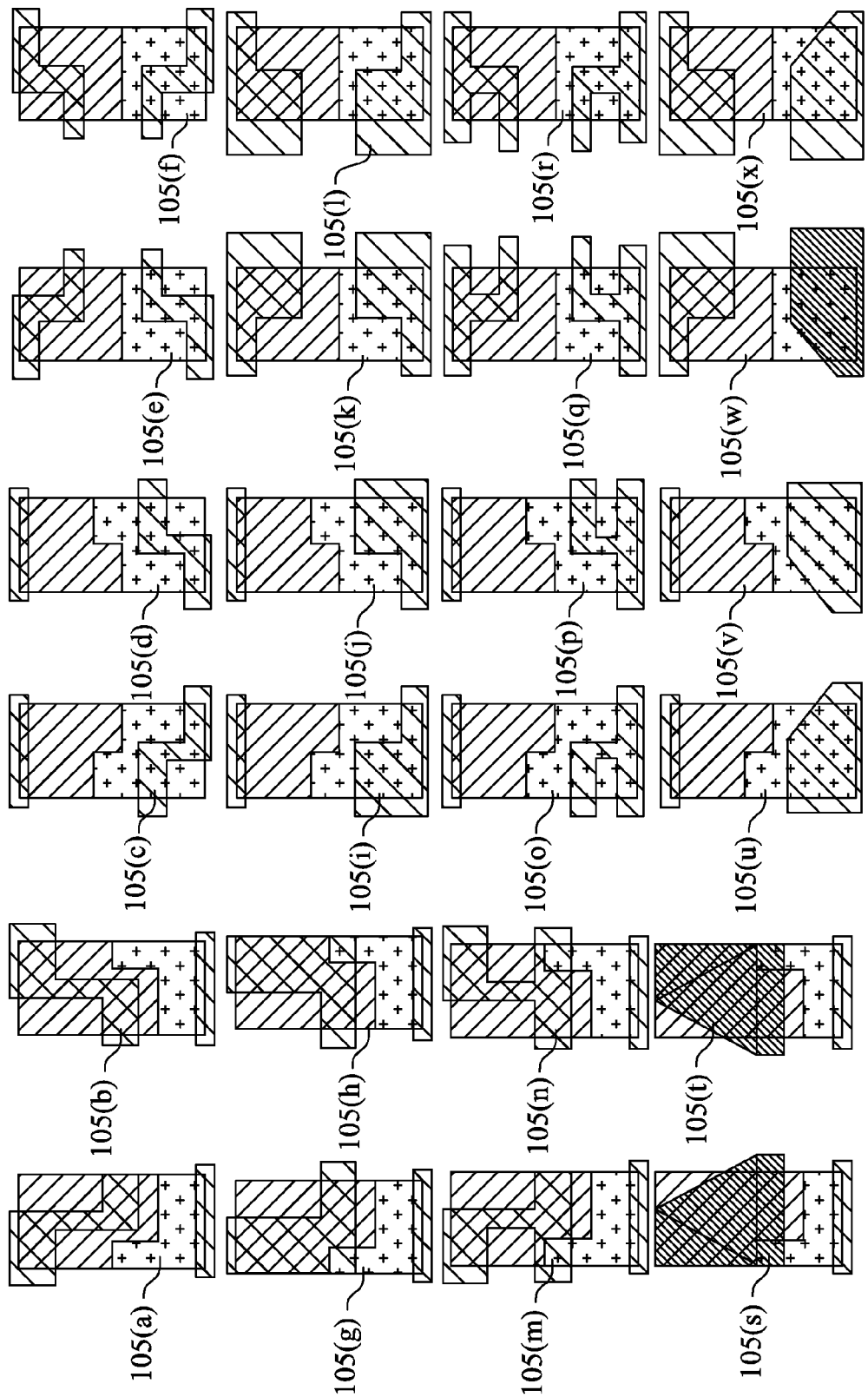
FIG. 4 is a diagram example converter cells, in accordance with some embodiments.

FIG. 4 is a diagram of various converter cell configurations, in accordance with one or more embodiments. Third cells 105(*a*)-105(*x*) are example embodiments of various configurations of the third cell 105 (FIG. 1) based on the height and/or doping region configuration differences between the first cell 101 (FIG. 1) and the second cell 103 (FIG. 1). The example third cells 105(*a*)-105(*r*) are in no way an exhaustive list of possible configurations. Third cells 105(*a*)-105(*f*) include S-shaped lines. Third cells 105(*g*)-105(1) include L-shaped lines. Third cells 105(*m*)-105(*r*) include J-shaped lines, wherein a power line or a ground line of the first cell 101 or the second cell 103 is divided into two separate lines, and the third cell 105 converts the split power or ground line to a single line. Third cells 105(*s*)-105(*x*) are trapezoidal-shaped lines. A ramp-shaped line is similar to a trapezoidal-shaped line in that the line has an increasing or decreasing line width between the first end or the second end of the third line 119 (FIG. 1). The lines of the third cell 105 are capable of being any suitable shape, or combination of shapes that are configured to couple power or ground lines of a first cell 101 (FIG. 1) and a second cell 103 (FIG. 1) such as a third cell 105 that includes an S-shaped third lines 119 (FIG. 1) and a J-shaped sixth line 133 (FIG. 1).

Figure 5:
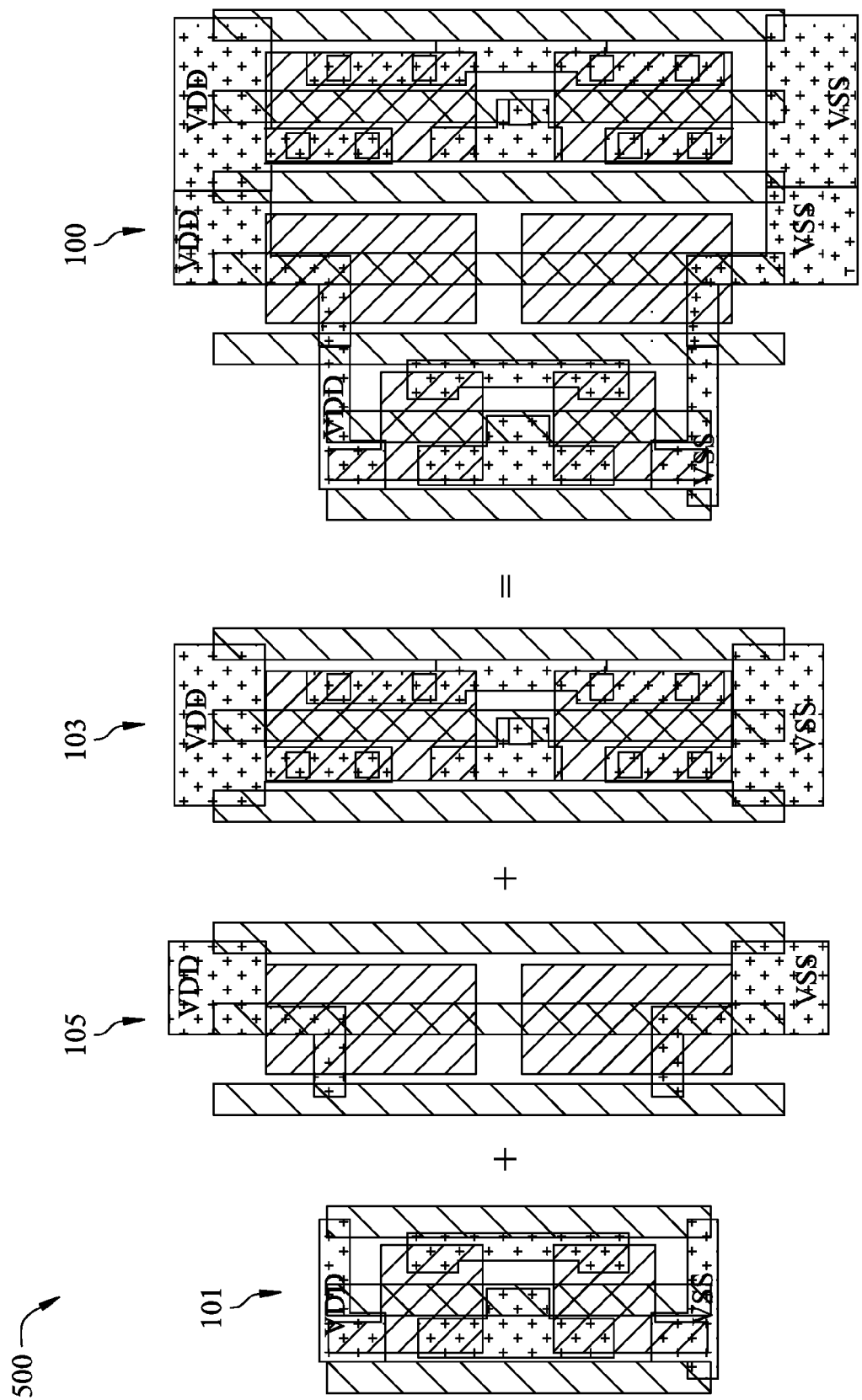
FIG. 5 is a diagram of a user interface, in accordance with some embodiments.

FIG. 5 is a diagram of a user interface 500 of an integrated circuit design system, in accordance with one or more embodiments. The integrated circuit design system includes a processor and a memory. The processor executes a set of computer-readable instructions that facilitate designing an integrated circuit such as integrated circuit 100 by way of user interface 500. First cell 101 is connected to third cell 105 which is connected to second cell 103 to generate integrated circuit 100. Based on one or more user inputs that included a selection or one or more descriptive parameters or a design of one or more of the first cell 101 and the second cell 103, the integrated circuit design system based on the computer readable instructions executed by the processor generates a third cell 105 that has the requisite features to couple the power and ground lines of the first cell 101 and the second cell 103. After the third cell 105 is generated, the third cell 105 is sandwiched between the first cell 101 and the second cell 103 such that the third cell 105 abuts one or more of the first cell 101 or the second cell 105.

Figure 6:
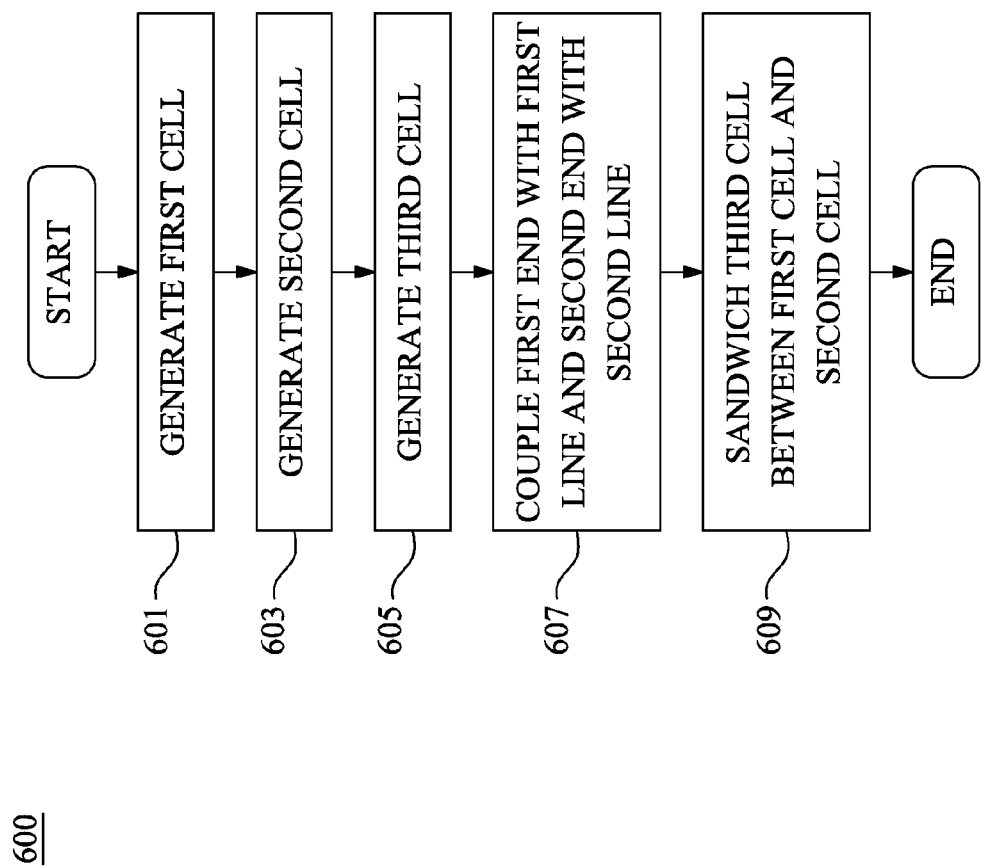
FIG. 6 is a flowchart of a method of designing an integrated circuit, in accordance with some embodiments.
Figure 7:
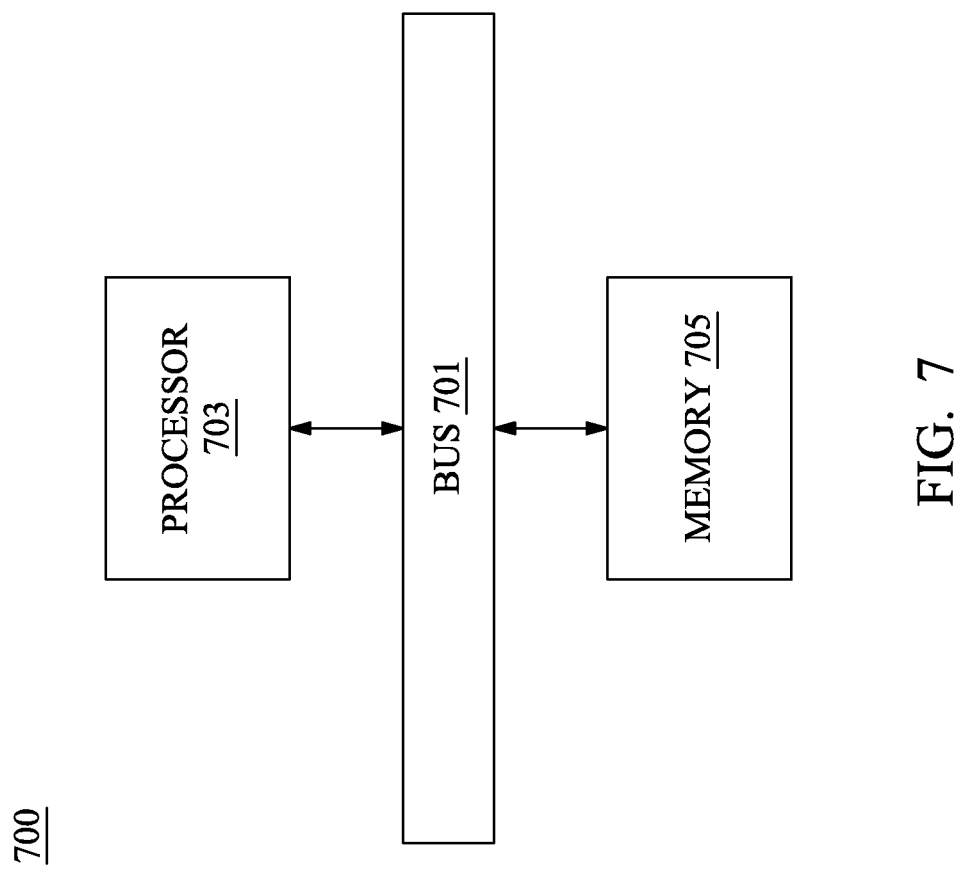
FIG. 7 is a diagram of a chipset upon which or by which an embodiment is implemented, in accordance with some embodiments.

FIG. 6 is a flowchart of a method 600 of designing an integrated circuit, in accordance with one or more embodiments. In some embodiments, method 600 is executed by a processor such as processor 703 (FIG. 7).

In step 601, a first cell such as first cell 101 (FIG. 1) is generated. The first cell has a first top surface and a first bottom surface, the first top surface separated from the first bottom surface by a first cell height. The first cell also has a first line routed at a first line height relative to the first bottom surface, the first line having a first line width.

In step 603, a second cell such as second cell 103 (FIG. 1) is generated. The second cell has a second top surface and a second bottom surface, the second top surface separated from the second bottom surface by a second cell height different from the first cell height. The second cell also has a second line routed at a second line height relative to the second bottom surface, the second line having a second line width different from the first line width.

In step 605, a third cell such as third cell 105 (FIG. 1) is generated. The third cell comprises a third line having a first end and a second end. The first end has a first end width. The second end has a second end width. The first end width is equal to the first line width, and the second end width is equal to the second line width.

In step 607, the first end is coupled with the first line, and the second end is coupled with the second line.

In step 609, the third cell is sandwiched between the first cell and the second cell such that the third cell is sandwiched in direct contact with the first cell and the second cell.

The processes described herein for coupling cells of different height within an integrated circuit are implemented via software in combination with hardware or firmware, hardware, firmware or a combination of software and firmware and/or hardware. For example, the processes described herein, may be advantageously implemented via a processor, Digital Signal Processing (DSP) chip, an Application Specific Integrated Circuit (ASIC), Field Programmable Gate Arrays FPGAs, etc. Such exemplary hardware for performing the described functions is detailed below.

FIG. 7 is a functional block diagram of a computer or processor-based system 700 upon which or by which an embodiment is implemented.

Processor-based system 700 is programmed to generate a converter cell that couples cells having different heights within an integrated circuit, as described herein, and includes, for example, bus 701, processor 703, and memory 705 components. In some embodiments, the processor-based system is implemented as a single "system on a chip." Processor-based system 700, or a portion thereof, constitutes a mechanism for performing one or more steps of generating a converter cell that couples cells having different heights within an integrated circuit In some embodiments, the processor-based system 700 includes a communication mechanism such as bus 701 for transferring information and/or instructions among the components of the processor-based system 700. Processor 703 is connected to the bus 701 to obtain instructions for execution and process information stored in, for example, the memory 705. In some embodiments, the processor 703 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 703. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 703 performs a set of operations on information as specified by a set of instructions stored in memory 705 related to generating a converter cell that couples cells having different heights within an integrated circuit. The execution of the instructions causes the processor to perform specified functions.

The processor 703 and accompanying components are connected to the memory 705 via the bus 701. The memory 705 includes one or more of dynamic memory (e.g., RAM, magnetic disk, writable optical disk, etc.) and static memory (e.g., ROM, CD-ROM, etc.) for storing executable instructions that when executed perform the steps described herein to generate a converter cell that couples cells having different heights within an integrated circuit. The memory 705 also stores the data associated with or generated by the execution of the steps.

In one or more embodiments, the memory 705, such as a random access memory (RAM) or any other dynamic storage device, stores information including processor instructions for generating a converter cell that couples cells having different heights within an integrated circuit. Dynamic memory allows information stored therein to be changed by system 700. RAM allows a unit of information stored at a location called a memory address to be stored and retrieved independently of information at neighboring addresses. The memory 705 is also used by the processor 703 to store temporary values during execution of processor instructions. In various embodiments, the memory 705 is a read only memory (ROM) or any other static storage device coupled to the bus 701 for storing static information, including instructions, that is not changed by the system 100. Some memory is composed of volatile storage that loses the information stored thereon when power is lost. In some embodiments, the memory 705 is a non-volatile (persistent) storage device, such as a magnetic disk, optical disk or flash card, for storing information, including instructions, that persists even when the system 100 is turned off or otherwise loses power.

The term "computer-readable medium" as used herein refers to any medium that participates in providing information to processor 703, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read. The term computer-readable storage medium is used herein to refer to a computer-readable medium.

An aspect of this description relates to an integrated circuit that comprises a first cell, a second cell and a third cell. The first cell having a first top surface and a first bottom surface. The first top surface is separated from the first bottom surface by a first cell height. The first cell also has a first line routed at a first line height relative to the first bottom surface. The first line has a first line width. The second cell has a second top surface and a second bottom surface. The second top surface is separated from the second bottom surface by a second cell height different from the first cell height. The second cell also has a second line routed at a second line height relative to the second bottom surface. The second line has a second line width different from the first line width. The third cell has a third line having a first end and a second end. The first end has a first end width. The second end has a second end width. The first end width is equal to the first line width. The second end width is equal to the second line width. The first end is coupled with the first line. The second end is coupled with the second line.

Another aspect of this description relates to a method of designing an integrated circuit. The method comprises generating, by a processor, a first cell having a first top surface and a first bottom surface, the first top surface separated from the first bottom surface by a first cell height. The first cell also has a first line routed at a first line height relative to the first bottom surface, the first line having a first line width. The method also comprises generating, by the processor, a second cell having a second top surface and a second bottom surface, the second top surface separated from the second bottom surface by a second cell height different from the first cell height. The second cell also has a second line routed at a second line height relative to the second bottom surface, the second line having a second line width different from the first line width. The method further comprises generating, by the processor, a third cell having a third line having a first end and a second end, the first end having a first end width, the second end having a second end width, the first end width being equal to the first line width, the second end width being equal to the second line width. The method additionally comprises coupling the first end with the first line, and the second end with the second line.

A further aspect of this description relates to an integrated circuit comprising a first cell, a second cell and a third cell. The first cell has a first top surface and a first bottom surface. The first top surface is separated from the first bottom surface by a first cell height. The first cell also has a first line routed at the first cell height. The first line has a first line width. The second cell has a second top surface and a second bottom surface. The second top surface is separated from the second bottom surface by a second cell height different from the first cell height. The second cell also has a second line routed at the second cell height. The second line has a second line width different from the first line width. The third cell has a third line having a first end and a second end. The first end has a first end width. The second end has a second end width. The first end width is equal to the first line width. The second end width is equal to the second line width. The first end is coupled with the first line. The second end is coupled with the second line. The first line, the second line, and the third line are one of power lines or ground lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit comprising:
  a first cell having:
    a first top surface and a first bottom surface, the first top surface separated from the first bottom surface by a first cell height; and a first line routed at a first line height relative to the first bottom surface, the first line having a first line width;
a second cell having:
a second top surface and a second bottom surface, the second top surface separated from the second bottom surface by a second cell height different from the first cell height;
a second line routed at a second line height relative to the second bottom surface, the second line having a second line width different from the first line width; and
a third cell having:
a third line having a first end and a second end, the first end having a first end width, the second end having a second end width, the first end width being equal to the first line width, the second end width being equal to the second line width, the first end being coupled with the first line, and the second end being coupled with the second line.

2. The integrated circuit of claim 1, wherein the third cell further comprises a third top surface and a third bottom surface, the third top surface being separated from the third bottom surface by a third cell height, and the third cell height being equal to the first cell height or the second cell height.

3. The integrated circuit of claim 2, wherein the third bottom surface is horizontally aligned with one or more of the first bottom surface or the second bottom surface.

4. The integrated circuit of claim 2, wherein
the first bottom surface, the second bottom surface, and the third bottom surface are horizontally misaligned, and
the first top surface, the second top surface, and the third top surface are horizontally misaligned.

5. The integrated circuit of claim 1, wherein the first line height is equal to the first cell height or the second line height is equal to the second cell height.

6. The integrated circuit of claim 1, wherein the first line, the second line, and the third line are power lines or ground lines.

7. The integrated circuit of claim 6,
the first cell further comprising a fourth line routed at a fourth line height relative to the first bottom surface, the fourth line having a fourth line width,
the second cell further comprising a fifth line routed at a fifth line height relative to the second bottom surface, the fifth line having a fifth line width,
the third cell further comprising a sixth line having a third end and a fourth end, the third end having a third end width, the fourth end having a fourth end width, the third end width being equal to the fourth line width, the fourth end width being equal to the fifth line width, the third end being coupled with the fourth line, and the fourth end being coupled with the fifth line, and
the fourth line, the fifth line, and the sixth line are the other of the power lines or the ground lines.

8. The integrated circuit of claim 7, wherein the fourth line height is different from the fifth line height.

9. The integrated circuit of claim 1,
the first cell further comprising a first doped region and a second doped region, the first doped region being separated from the second doped region by a first boundary, the first boundary having a first boundary height relative to the first bottom surface;
the second cell further comprising a third doped region and a fourth doped region, the third doped region being separated from the fourth doped region by a second boundary, the second boundary having a second boundary height relative to the second bottom surface; and
the third cell further comprising a fifth doped region and a sixth doped region, the fifth doped region being separated from the sixth doped region by a third boundary; the third boundary being horizontally aligned with the first boundary and the second boundary.

10. The integrated circuit of claim 9, wherein the first boundary height is equal to the second boundary height.

11. The integrated circuit of claim 9, wherein the first boundary height is different from the second boundary height, the third boundary has a first portion horizontally aligned with the first boundary, and the third boundary has a second portion horizontally aligned with the second boundary.

12. The integrated circuit of claim 9, wherein the third line is routed parallel to the third boundary.

13. The integrated circuit of claim 1, wherein the third line is routed having one of an S-shape, an L-shape, or a J-shape.

14. The integrated circuit of claim 1, wherein the third cell is between the first cell and the second cell, and the third cell abuts one or more of the first cell or the second cell.

15. A method of designing an integrated circuit, the method comprising:
generating, by a processor, a first cell having:
a first top surface and a first bottom surface, the first top surface separated from the first bottom surface by a first cell height; and
a first line routed at a first line height relative to the first bottom surface, the first line having a first line width;
generating, by the processor, a second cell having:
a second top surface and a second bottom surface, the second top surface separated from the second bottom surface by a second cell height different from the first cell height;
a second line routed at a second line height relative to the second bottom surface, the second line having a second line width different from the first line width;
generating, by the processor, a third cell having:
a third line having a first end and a second end, the first end having a first end width, the second end having a second end width, the first end width being equal to the first line width, the second end width being equal to the second line width; and
coupling the first end with the first line, and the second end with the second line.

16. The method of claim 15, wherein the first line, the second line, and the third line are power lines or ground lines.

17. The method of claim 16, further comprising:
sandwiching the third cell between the first cell and the second cell, the third cell being sandwiched in direct contact with the first cell and the second cell.

18. An integrated circuit comprising:
a first cell having:
a first top surface and a first bottom surface, the first top surface separated from the first bottom surface by a first cell height; and
a first line routed at the first cell height, the first line having a first line width;
a second cell having:
a second top surface and a second bottom surface, the second top surface separated from the second bottom surface by a second cell height different from the first cell height; and a second line routed at the second cell height, the second line having a second line width different from the first line width; and a third cell having:

a third line having a first end and a second end, the first end having a first end width, the second end having a second end width, the first end width being equal to the first line width, the second end width being equal to the second line width, the first end being coupled with the first line, and the second end being coupled with the second line, wherein the first line, the second line, and the third line are power lines or ground lines.

19. The integrated circuit of claim 18, the first cell further comprising a fourth line routed along the first bottom surface, the fourth line having a fourth line width;

the second cell further comprising a fifth line routed along the second bottom surface, the fifth line having a fifth line width;

the third cell further comprising a sixth line having a third end and a fourth end, the third end having a third end width, the fourth end having a fourth end width, the third end width being equal to the fourth line width, the fourth end width being equal to the fifth line width, the third end being coupled with the fourth line, and the fourth end being coupled with the fifth line; and the fourth line, the fifth line, and the sixth line are the other of the power lines or the ground lines.

20. The integrated circuit of claim 18, the first cell further comprising a first doped region and a second doped region, the first doped region is separated from the second doped region by a first boundary, the first boundary having a first boundary height relative to the first bottom surface;

the second cell further comprising a third doped region and a fourth doped region, the third doped region is separated from the fourth doped region by a second boundary, the second boundary having a second boundary height relative to the second bottom surface;

the third cell further comprising a fifth doped region and a sixth doped region, the fifth doped region is separated from the sixth doped region by a third boundary; and the third boundary is horizontally aligned with the first boundary and the second boundary.

\* \* \* \* \*